(12) United States Patent
Takasu et al.

(10) Patent No.: US 11,631,620 B2
(45) Date of Patent: Apr. 18, 2023

(54) SEMICONDUCTOR DEVICE AND METHOD OF TESTING A SEMICONDUCTOR DEVICE

(71) Applicant: ABLIC Inc., Tokyo (JP)

(72) Inventors: Hiroaki Takasu, Tokyo (JP); Yoko Serizawa, Tokyo (JP); Hiroya Suzuki, Tokyo (JP); Sumitaka Goto, Tokyo (JP)

(73) Assignee: ABLIC INC., Tokyo (JP)

( * ) Notice: Subject to any disclaimer, the term of this patent is extended or adjusted under 35 U.S.C. 154(b) by 380 days.

(21) Appl. No.: 16/923,540

(22) Filed: Jul. 8, 2020

(65) Prior Publication Data

US 2021/0013114 A1 Jan. 14, 2021

(30) Foreign Application Priority Data

Jul. 8, 2019 (JP) .............................. JP2019-127013

(51) Int. Cl.
*H01L 21/66* (2006.01)
*G01R 31/28* (2006.01)

(52) U.S. Cl.
CPC .......... *H01L 22/34* (2013.01); *G01R 31/2884* (2013.01); *H01L 22/14* (2013.01)

(58) Field of Classification Search
CPC ......... H01L 22/10; H01L 22/14; H01L 22/30; H01L 22/34; G01R 31/2884
See application file for complete search history.

(56) References Cited

U.S. PATENT DOCUMENTS

| | | | | |
|---|---|---|---|---|
| 6,962,827 B1 * | 11/2005 | Furue | ...................... | H01L 22/34 438/14 |
| 7,307,441 B2 * | 12/2007 | Sohn | ....................... | H01L 22/32 438/18 |
| 7,560,946 B2 * | 7/2009 | Bickford | ............ | G01R 31/2648 700/121 |
| 7,884,892 B2 * | 2/2011 | Ishii | ....................... | G02F 1/1345 349/149 |
| 8,673,657 B2 * | 3/2014 | Nagai | ..................... | H01L 22/34 257/E21.524 |
| 8,779,790 B2 * | 7/2014 | Vilas Boas | ...... | G01R 31/31701 714/724 |
| 9,607,911 B2 * | 3/2017 | Liu | ..................... | G01R 31/2884 |
| 10,665,557 B2 * | 5/2020 | Han | ....................... | H01L 23/562 |
| 11,139,199 B2 * | 10/2021 | Han | ....................... | H01L 23/585 |
| 2005/0046473 A1 * | 3/2005 | Furue | .................. | G01R 31/2884 327/565 |
| 2008/0265928 A1 * | 10/2008 | Tsuchiya | .......... | G01R 31/31919 324/750.3 |

(Continued)

FOREIGN PATENT DOCUMENTS

| | | | |
|---|---|---|---|
| JP | H05-175430 A | 7/1993 | |
| JP | 2012-174789 A | 9/2012 | |
| KR | 20080061032 A * | 7/2008 | ............ H01L 22/34 |

*Primary Examiner* — Eduardo A Rodela
(74) *Attorney, Agent, or Firm* — Crowell & Moring LLP

(57) ABSTRACT

Provided is a semiconductor device that allows reduction of a measurement time of a PCMTEG and improvement of productivity in an IC manufacturing process. A PCMTEG region 100 formed on a surface of a semiconductor substrate is divided into a main PCMTEG region 101 and a sub-PCMTEG region 102, and TEGs having specifications for their electrical characteristic values are all collectively arranged in the sub-PCMTEG region 102.

5 Claims, 3 Drawing Sheets

(56) References Cited

U.S. PATENT DOCUMENTS

2009/0008641 A1\* 1/2009 Michimata ........... G01R 27/205
 324/693
2011/0227609 A1\* 9/2011 Kushiyama ............ H03K 17/18
 327/141

\* cited by examiner

SEMICONDUCTOR DEVICE AND METHOD OF TESTING A SEMICONDUCTOR DEVICE

RELATED APPLICATIONS

This application claims priority to Japanese Patent Application No. 2019-127013, filed on Jul. 8, 2019, the entire content of which is incorporated herein by reference.

BACKGROUND OF THE INVENTION

1. Field of the Invention

The present invention relates to a semiconductor device including PCMTEGs and a method of testing a semiconductor device having a PCMTEG region.

2. Description of the Related Art

A test-element-group (hereinafter referred to as "TEG") for evaluation may be arranged in a semiconductor integrated circuit device, which is formed on a semiconductor substrate. Among these TEGs, the TEGs having semiconductor elements to check the quality of the semiconductor wafer manufacturing process are called the Process Control Monitor Test Element Group (hereinafter referred to as "PCMTEG").

The PCMTEG may be arranged in a scribe line region along which a plurality of IC chips is cut out (scribe line TEG), or may be arranged in a specific region without forming the IC chips (external TEG).

By making electrical measurements using PCMTEG near the end of the semiconductor wafer manufacturing process, it is possible to confirm whether the semiconductor wafer manufacturing process has been carried out normally and whether the product characteristics have been achieved as intended. Electrical measurements of the PCMTEG are usually made by using a probe card with a plurality of probes (probe needles) and bringing the needles into contact with pad regions provided in various types of TEGs arranged in the PCMTEG region.

In order to improve productivity and manufacturing efficiency, the measurement of the PCMTEG should be performed in a time as short as possible. The probe card must be moved in order to bring the needles into contact with a plurality of desired PCMTEGs. Since the distance the probe card moves increases the time and the load of the PCMTEG measurement, the measurement of the PCMTEG should be performed in a time as short as possible.

Further, by a defective contact of the needle with the PCMTEG, an accurate measurement value may not be obtained, and re-measurement may be required. Thus, the load may increase. Moreover, in the absence of notice to the bad needle-contact state, quality defect of the IC may be overlooked.

In Japanese Patent Application Laid-open No. 2012-174789, the PCMTEG arranged on the scribe line and the width of the scribe line are referred to, and there is described an idea to increase the number of IC chips that can be obtained from the semiconductor water surface.

In the semiconductor device described in Japanese Patent Application Laid-open No. 2012-174789, the width of the scribe line on a side on which no PCMTEG is arranged is decreased. In this manner, the number of ICs that can be obtained and manufactured from the entire semiconductor wafer can be increased, thereby contributing to improvement in productivity. However, reduction of the PCMTEG measurement time is not referred to. The reduction of the PCMTEG measurement time is essential in order to improve the productivity and to reduce the workload in the IC manufacturing process.

SUMMARY OF THE INVENTION

The present invention provides a semiconductor device that allows reduction of a measurement time of a PCMTEG.

A semiconductor device according to at least one embodiment of the present invention adopts the following measures.

There is adopted a semiconductor device having a semiconductor substrate; a PCMTEG region formed on a surface of the semiconductor substrate; the PCMTEG has a plurality of TEGs each of which is classified by a type; a main PCMTEG region and a sub-PCMTEG region arranged in the PCMTEG region; and a plurality of TEG classification regions sectioned by the type of a TEG, and included in the main PCMTEG region; all the TEGs having specifications for electrical characteristic values selected from respective types of the TEGs are arranged in the sub-PCM TEG region.

Further, there is adopted a method of testing a semiconductor device having a PCMTEG region formed on a surface of a semiconductor substrate, the method including identifying a sub-PCMTEG region in the PCMTEG region; performing probing test with respect to all TEGs in the sub-PCMTEG region in order; and determining electrical characteristic values of the all TEGs in the sub-PCMTEG region with reference to specifications.

According to the present invention, a plurality of TEGs having specifications in electrical characteristic values is collectively arranged in the sub-PCMTEG region included in the PCMTEG region, permitting reduction of the measurement time of the PCMTEG.

DETAILED DESCRIPTION OF THE PREFERRED EMBODIMENTS

Embodiments of the present invention are described in detail below with reference to the accompanying drawings.

First Embodiment

Now, a semiconductor device according to a first embodiment of the present invention is described.

Before the embodiments of the present invention are described, a conventional semiconductor device is described.

Figure 4:
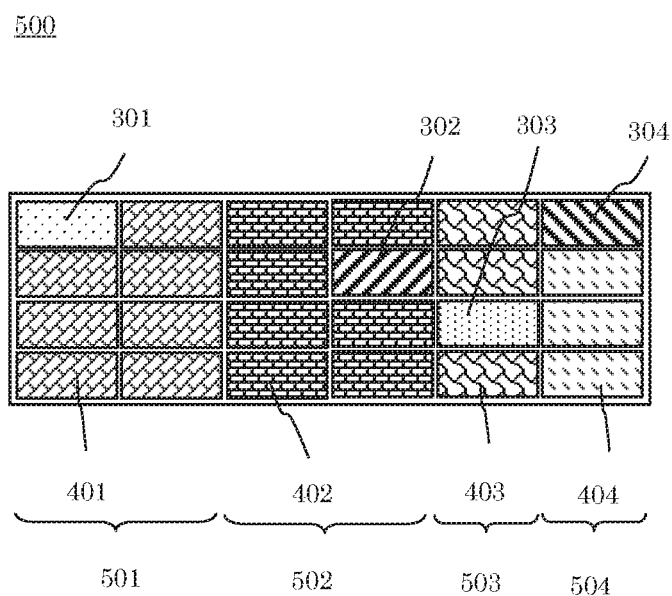
FIG. 4 is a schematic plan view of a conventional semiconductor device.

FIG. 4 is a schematic plan view of the conventional semiconductor device. A PCMTEG region 500 is a region for evaluating quality of a semiconductor wafer manufacturing process. The PCMTEG region 500 includes a plurality of test-element-groups (TEGs) of different types. In the example of FIG. 4, an N-type MOS transistor TEG region

501, a P-type MOS transistor TEG region 502, a resistor TEG region 503, and a capacitor TEG region 504 are arranged in the PCMTEG region 500 so as to be sectioned according to the type of the test-element-group (TEG).

Further, in the PCMTEG region 500, TEGs having no specifications for their electrical characteristics and TEGs having specifications for their electrical characteristics are irregularly arranged in a scattered manner. The TEGs having specifications for their electrical characteristics are illustrated as an N-type MOS transistor TEG 301 having a specification for its electrical characteristic value, a P-type MOS transistor TEG 302 having a specification for its electrical characteristic value, a resistor TEG 303 having a specification for its electrical characteristic value, and a capacitor TEG 304 having a specification for its electrical characteristic value.

In the "TEG having a specification for its electrical characteristic", an upper-limit specification or a lower-limit specification is set with respect to a measurement value of an electrical characteristic. In the case where the measurement value of the "TEG having a specification for its electrical characteristic" exceeds the upper-limit specification or falls below the lower-limit specification, the semiconductor device subjected to measurement is judged to be out of the specification, and re-examination or other responses are performed. Meanwhile, in the "TEG having no specification for its electrical characteristic", an upper-limit specification or a lower-limit specification is not set with respect to the measurement value of the electrical characteristic.

As described above, in the conventional semiconductor device illustrated in FIG. 4, the N-type MOS transistor TEG 301 having a specification for its electrical characteristic value, the P-type MOS transistor TEG 302 having a specification for its electrical characteristic value, the resistor TEG 303 having a specification for its electrical characteristic value, and the capacitor TEG 304 having a specification for its electrical characteristic value are each arranged in a region for a group of TEGs of the same type to which the corresponding TEG belongs, that is, are arranged in a scattered manner in the N-type MOS transistor TEG region 501, the P-type MOS transistor TEG region 502, the resistor TEG region 503, and the capacitor TEG region 504, respectively. In the measurement of the TEGs having specifications for their electrical characteristic values, a probe card for evaluation or probes for evaluation should be greatly moved in order of the N-type MOS transistor TEG region 501, the P-type MOS transistor TEG region 502, the resistor TEG region 503, and the capacitor TEG region 504. Thus, a long measurement time is required. Further, a probing state easily changes on each occasion, and it may be difficult to stably obtain an accurate characteristic value.

Next, the embodiments of the present invention are described.

Figure 1A:
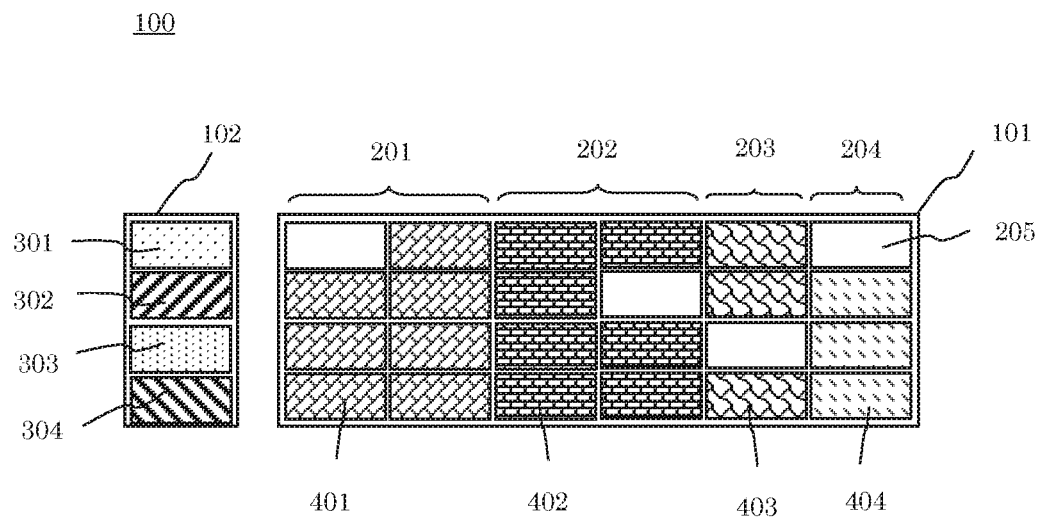
FIG. 1A and FIG. 1B are schematic plan views of a semiconductor device according to a first embodiment of the present invention.
Figure 1B:
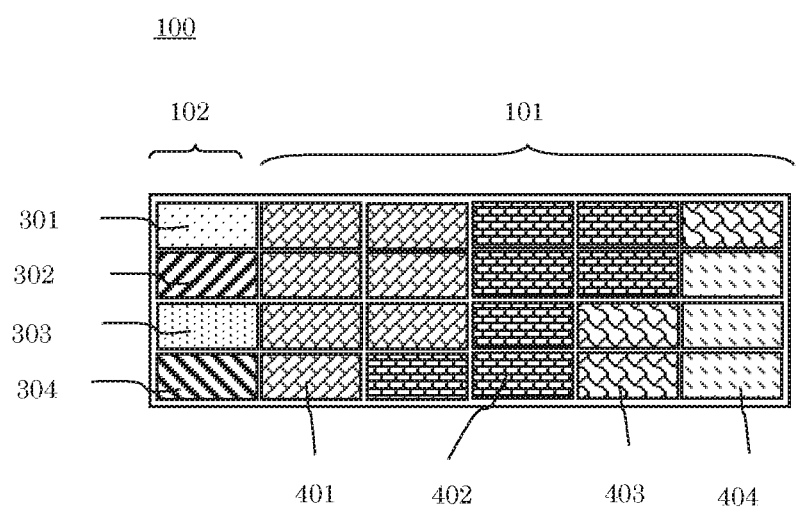

FIG. 1A and FIG. 1B are schematic plan views of the semiconductor device according to the first embodiment of the present invention.

A PCMTEG region 100 formed on a surface of a semiconductor substrate is a region for evaluating quality of a semiconductor wafer manufacturing process. The PCMTEG region 100 includes a plurality of types of TEGs, such as N-type MOS transistors, P-type MOS transistors, resistors, and capacitors. Although not shown, the PCMTEG region 100 is arranged at one or a plurality of locations in the semiconductor substrate.

In the first embodiment of the present invention illustrated in FIG. 1A, unlike the related-art semiconductor device illustrated in FIG. 4, the PCMTEG region 100 includes a main PCMTEG region 101 and a sub-PCMTEG region 102. The main PCMTEG region 101 includes a plurality of TEG classification regions 201, 202, 203, and 204 sectioned by the type of the test-element-group (TEG). The TEG classification regions 201, 202, 203, and 204 are assigned as, for example, an N-type MOS transistor TEG region 201, a P-type MOS transistor TEG region 202, a resistor TEG region 203, and a capacitor TEG region 204.

As illustrated in FIG. 1A, it is preferred that both of the main PCMTEG region 101 and the sub-PCMTEG region 102 have rectangular outer shapes, and the main PCMTEG region 101 is arranged apart from the sub-PCMTEG region 102 with a predetermined distance, for example, a distance of from 50 µm to 100 µm, so that the identification therebetween becomes easier. Further, for identification, an identification mark (not shown) is arranged on each of the main PCMTEG region 101 and the sub-PCMTEG region 102.

In the sub-PCMTEG region 102, only TEGs having specifications for their electrical characteristic values, that is, TEGs with specifications are arranged. Specifically, an N-type MOS transistor TEG 301 having a specification for its electrical characteristic value, a P-type MOS transistor TEG 302 having a specification for its electrical characteristic value, a resistor TEG 303 having a specification for its electrical characteristic value, and a capacitor TEG 304 having a specification for its electrical characteristic value are collectively arranged.

In contrast, in the main PCMTEG region 101, N-type MOS transistor TEGs 401 having no specifications for their electrical characteristic values are arranged in the N-type MOS transistor TEG region 201, P-type MOS transistor TEGs 402 having no specifications for their electrical characteristic values are arranged in the P-type MOS transistor TEG region 202, resistor TEGs 403 having no specifications for their electrical characteristic values are arranged in the resistor TEG region 203, and capacitor TEGs 404 having no specifications for their electrical characteristic values are arranged in the capacitor TEG region 204. Further, non-TEG portions 205 are arranged in the main PCMTEG region 101. That is, in the main PCMTEG region 101, TEGs having no specifications for their electrical characteristic values, that is, TEGs without specifications are arranged. In the case of this configuration, the TEGs arranged in the main PCMTEG region 101 and the TEGs arranged in the sub-PCMTEG region 102 do not overlap. Further, the types of the test-element-groups (TEGs) arranged in the main PCMTEG region 101 and the types of the TEGs arranged in the sub-PCMTEG region 102 are the same, and the number of TEGs arranged in the sub-PCMTEG region 102 is equal to or larger than the number of types of the TEGs. That is, in the sub-PCMTEG region 102, at least one TEG is arranged for each type. The non-TEG portions 205 are parts in which no TEGs are arranged. Those parts can be compressed to reduce the area to be occupied by the main PCMTEG region 101. In FIG. 1A, the main PCMTEG region having an arrangement of four by six can be reduced to an arrangement of four by five.

In the absence of an arrangement area of the PCMTEG region, as illustrated in FIG. 1B, the main PCMTEG region 101 can be arranged in contact with the sub-PCMTEG region 102. In this case, the PCMTEG region 100 in which the TEGs are arranged in n rows by m columns has a rectangular outer shape. The sub-PCMTEG region 102 is provided in contact with at least one of the four corners of the rectangular PCMTEG region 100, or in contact with one of the four sides forming the rectangle, and the remaining region is set as the main PCMTEG region 101.

Since the PCMTEG region 100 employs such arrangement, at the time of electrical evaluation of the semiconductor device, the movement distance of the probe card for evaluation or the probes for evaluation is reduced, and the time required for the measurement is reduced. In this manner, the productivity can be improved, and the load of the work related to the evaluation step can be reduced.

Next, with reference to FIG. 1A and FIG. 1B, description is given of a method of testing a semiconductor device according to the first embodiment of the present invention. First, the semiconductor substrate is placed on a test table of a probing apparatus, and the identification mark (not shown) put on each of the main PCMTEG region 101 and the sub-PCMTEG region 102 is recognized by an optical tester of the probing apparatus, so that the sub-PCMTEG region 102 corresponding to a probing test region is set as the probing test region. Alternatively, the probing test region is set through use of coordinates on the semiconductor substrate of the sub-PCMTEG region 102, which have been entered in advance.

Next, the TEGs having specifications for their electrical characteristic values in the sub-PCMTEG region 102, that is, the N-type MOS transistor TEG 301 having a specification for its electrical characteristic value, the P-type MOS transistor TEG 302 having a specification for its electrical characteristic value, the resistor TEG 303 having a specification for its electrical characteristic value, and the capacitor TEG 304 having a specification for its electrical characteristic value are subjected to probing test in the stated order. As described above, the probing test is performed in order from the TEG positioned at one end of the sub-PCMTEG region 102 to the adjacent TEGs. In this manner, the movement distance of the probe card can be decreased, and the measurement time can be reduced. Thus, the productivity can be improved. Next, the electrical characteristic value obtained by the measurement of each of the TEGs is determined with reference to a predetermined specification such as an upper-limit specification or a lower-limit specification. The electrical characteristic value of at least one of the TEGs is out of the specification, re-examination or other responses are performed.

Second Embodiment

Next, a second embodiment of the present invention is described.

Figure 2:
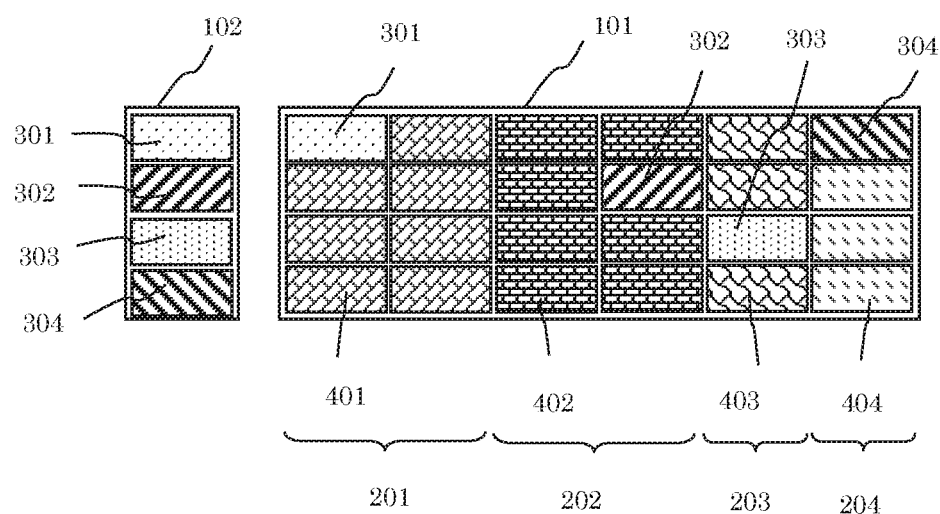
FIG. 2 is a schematic plan view of a semiconductor device according to a second embodiment of the present invention.

FIG. 2 is a schematic plan view of a semiconductor device according to the second embodiment of the present invention. Same parts as those of the first embodiment described with reference to FIG. 1A and FIG. 1B are denoted by same reference symbols to omit the description.

As illustrated in FIG. 2, in the second embodiment, similarly to the first embodiment, the PCMTEG region 100 includes the main PCMTEG region 101 and the sub-PCMTEG region 102. In the sub-PCMTEG region 102, the N-type MOS transistor TEG 301 having a specification for its electrical characteristic value, the P-type MOS transistor TEG 302 having a specification for its electrical characteristic value, the resistor TEG 303 having a specification for its electrical characteristic value, and the capacitor TEG 304 having a specification for its electrical characteristic value are collectively arranged.

In contrast, in the main PCMTEG region 101, the TEGs having no specifications for their electrical characteristic values and the TEGs having specifications for their electrical characteristic values are both arranged. For example, in the N-type MOS transistor TEG region 201, the N-type MOS transistor TEGs 401 having no specifications for their electrical characteristic values and the N-type MOS transistor TEG 301 having a specification for its electrical characteristic value are both arranged. In the P-type MOS transistor TEG region 202, the P-type MOS transistor TEGs 402 having no specifications for their electrical characteristic values and the N-type MOS transistor TEG 302 having a specification for its electrical characteristic value are both arranged. In the resistor TEG region 203, the resistor TEGs 403 having no specifications for their electrical characteristic values and the resistor TEG 303 having a specification for its electrical characteristic value are both arranged. In the capacitor TEG region 204, the capacitor TEGs 404 having no specifications for their electrical characteristic values and the capacitor TEG 304 having a specification for its electrical characteristic value are both arranged.

At a stage of PCMTEG measurement for evaluating the quality of the semiconductor wafer manufacturing process, as in the first embodiment, specific TEGs having specifications for their electrical characteristic values, that is, TEGs with specifications in the sub-PCMTEG region 102 are only required to be measured. However, in some cases, the TEGs having no specifications for their electrical characteristic values and the TEGs having specifications for their electrical characteristic values are both subjected to additional evaluation (for example, measurement to be manually performed at a laboratory). At this time, the TEGs having specifications for their electrical characteristic values are arranged only in the sub-PCMTEG region 102 separated apart from the main PCMTEG region 101, inconvenience may be rather caused.

There is a room for an area to be occupied by the main PCMTEG region 101, although overlapping occurs, the N-type MOS transistor TEG 301 having a specification for its electrical characteristic value, the P-type MOS transistor TEG 302 having a specification for its electrical characteristic value, the resistor TEG 303 having a specification for its electrical characteristic value, and the capacitor TEG 304 having a specification for its electrical characteristic value, which are collectively arranged in the sub-PCMTEG region 102, may also be left and arranged in the main PCMTEG region 101. This arrangement provides convenience.

As described above, the TEGs having specifications for their electrical characteristic values are arranged in both of the main PCMTEG region 101 and the sub-PCMTEG region 102. In this manner, in the additional evaluation, it is only required to evaluate the TEGs in the main PCMTEG region 101 in which the TEGs having no specifications for their electrical characteristic values and the TEGs having specifications for their electrical characteristic values are both arranged.

Third Embodiment

Next, a third embodiment of the present invention is described.

Figure 3:
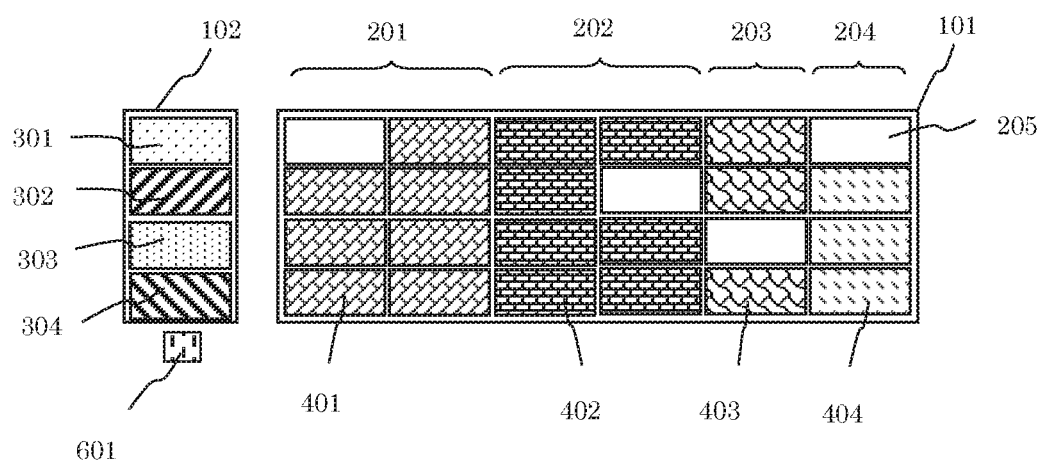
FIG. 3 is a schematic plan view of a semiconductor device according to a third embodiment of the present invention.

FIG. 3 is a schematic plan view of a semiconductor device according to the third embodiment of the present invention.

Same parts as those of the first embodiment described with reference to FIG. 1A and FIG. 1B and those of the second embodiment described with reference to FIG. 2 are denoted by same reference symbols to omit the description.

In the third embodiment of the present invention illustrated in FIG. 3, in addition to the N-type MOS transistor TEG 301 having a specification for its electrical characteristic value, the P-type MOS transistor TEG 302 having a specification for its electrical characteristic value, the resistor TEG 303 having a specification for its electrical characteristic value, and the capacitor TEG 304 having a specification for its electrical characteristic value, which are collectively arranged in the sub-PCMTEG region 102, a TEG 601 for checking probing is arranged.

In a PCMTEG measuring step of measuring electrical characteristics of a plurality of TEGs by bringing needles into contact (probing), it is very important to accurately bring the needles into contact. In the third embodiment, the TEG 601 for checking probing is arranged together, and hence it is possible to simultaneously check whether the needles are accurately brought into contact.

Although not shown, the TEG 601 for checking probing has a smaller needle-contact region as compared to that of a normal TEG for measurement to enable detection of planar positional misalignment of the needles, or has a sectional structure different from that of the normal TEG, for example, has a needle-contact region formed of a metal in the first layer although the normal TEG has the needle-contact region formed of a metal in the second layer, to thereby enable verification of a needle-contact state in a height direction.

Next, with reference to FIG. 3, description is given of a method of testing a semiconductor device according to the third embodiment of the present invention. First, the semiconductor substrate is placed on the test table of the probing apparatus, and the identification mark (not shown) put on each of the main PCMTEG region 101 and the sub-PCMTEG region 102 is recognized by the optical tester of the probing apparatus, so that the sub-PCMTEG region 102 corresponding to the probing test region is set as the probing test region. Alternatively, the probing test region is set through use of coordinates on the semiconductor substrate of the sub-PCMTEG region 102, which have been entered in advance. Next, a probe needles included in the probe card are brought into contact with the TEG 601 for checking probing provided near the sub-PCMTEG region 102 to verify whether the needle-contact state is normal.

Next, the TEGs having specifications for their electrical characteristic values in the sub-PCMTEG region 102, that is, the capacitor TEG 304 having a specification for its electrical characteristic value, the resistor TEG 303 having a specification for its electrical characteristic value, the P-type MOS transistor TEG 302 having a specification for its electrical characteristic value, and the N-type MOS transistor TEG 301 having a specification for its electrical characteristic value are subjected to probing test in the stated order. In this case, after the needles are brought into contact with the TEG 601 for checking probing, measurement is performed from the capacitor TEG 304 having a specification for its electrical characteristic value, which is arranged close to the TEG 601 for checking probing in the sub-PCMTEG region 102, and subsequently adjacent TEGs are subjected to probing test in order. In this manner, the movement distance of the probe card can be decreased, and the measurement time can be reduced. Thus, the productivity can be improved. Next, the electrical characteristic value obtained by the measurement of each of the TEGs is determined with reference to a predetermined specification such as an upper-limit specification or a lower-limit specification. The electrical characteristic value of each of the TEGs is not up to the specification, re-examination or other responses are performed.

In the third embodiment, the main PCMTEG region 101 may employ a mode in which, as in the first embodiment, only the TEGs having no specifications for their electrical characteristic values are arranged, or a mode in which, as in the second embodiment, the TEGs having no specifications for their electrical characteristic values and the TEGs having specifications for their electrical characteristic values are both arranged. Further, since the TEG 601 for checking probing to be used to verify the needle-contact state is arranged adjacent to the sub-PCMTEG region 102, a stable and accurate electrical characteristic value can be obtained.

What is claimed is:

1. A semiconductor device, comprising:
   a semiconductor substrate;
   a process control monitor test element group (PCMTEG) region formed on a surface of the semiconductor substrate, the PCMTEG has a plurality of test-element-groups (TEGs) each of which is classified by a type;
   a main PCMTEG region and a sub-PCMTEG region arranged in the PCMTEG region; and
   wherein: some of the TEGs having specifications for electrical characteristic values selected from respective types of the TEGs are arranged in the sub-PCMTEG region, and
      the TEGs having no specifications for electrical characteristic values are arranged in the main PCMTEG region.

2. The semiconductor device according to claim 1, wherein some of the TEGs having specifications for electrical characteristic values are further arranged in the main PCMTEG region.

3. The semiconductor device according to claim 1, wherein the types of the TEGs include at least an N-type MOS transistor, a P-type MOS transistor, a resistor, and a capacitor.

4. The semiconductor device according to claim 1, further comprising a TEG for checking probing is arranged adjacent to the sub-PCMTEG region.

5. A method of testing a semiconductor device having a process control monitor test element group (PCMTEG) region formed on a surface of a semiconductor substrate, the method comprising:
   identifying a sub-PCMTEG region in the PCMTEG region, test-element-groups (TEGs) being arranged in the sub-PCMTEG region;
   checking probing through use of a TEG for checking probing;
   performing probing test with respect to all TEGs in the sub-PCMTEG region in order from a TEG arranged closer to the TEG for checking probing; and
   determining electrical characteristic values of the all TEGs in the sub-PCMTEG region with reference to specifications.

\* \* \* \* \*